(12) United States Patent
Roy et al.

(10) Patent No.: US 12,124,165 B2
(45) Date of Patent: Oct. 22, 2024

(54) APPARATUS AND METHOD FOR OPTIMIZING ACTUATOR FORCES

(71) Applicant: CANON KABUSHIKI KAISHA, Tokyo (JP)

(72) Inventors: Nilabh K. Roy, Austin, TX (US); Anshuman Cherala, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/509,763

(22) Filed: Oct. 25, 2021

(65) Prior Publication Data

US 2023/0127984 A1   Apr. 27, 2023

(51) Int. Cl.
  *G03F 7/00* (2006.01)
  *G03F 9/00* (2006.01)
  *B82Y 40/00* (2011.01)

(52) U.S. Cl.
  CPC .......... *G03F 7/0002* (2013.01); *G03F 9/7042* (2013.01); *G03F 9/7092* (2013.01); *B82Y 40/00* (2013.01)

(58) Field of Classification Search
  CPC ....... B29C 59/002; B29C 59/026; G03F 9/00; G03F 9/7042; G03F 7/0002; G03F 7/705
  USPC ....................................................... 264/293
  See application file for complete search history.

(56) References Cited

U.S. PATENT DOCUMENTS

| | | |
|---|---|---|
| 6,873,087 B1 | 3/2005 | Choi et al. |
| 6,916,585 B2 | 7/2005 | Sreenivasan et al. |
| 6,932,934 B2 | 8/2005 | Choi et al. |
| 7,157,036 B2 | 1/2007 | Choi et al. |
| 7,170,589 B2 | 1/2007 | Cherala et al. |
| 7,298,456 B2 | 11/2007 | Cherala et al. |
| 7,420,654 B2 | 9/2008 | Cherala et al. |
| 7,828,984 B2 | 11/2010 | Seki et al. |
| 8,387,482 B2 | 3/2013 | Choi et al. |
| 8,845,317 B2 | 9/2014 | Suehira et al. |
| 9,573,319 B2 | 2/2017 | Okushima et al. |
| 9,579,843 B2 | 2/2017 | Okushima et al. |
| 10,216,104 B2 | 2/2019 | Nakagawa |
| 10,635,072 B2 | 4/2020 | Kobayashi |
| 2004/0124566 A1 | 7/2004 | Sreenivasan et al. |
| 2004/0188381 A1 | 9/2004 | Sreenivasan |
| 2004/0211754 A1 | 10/2004 | Sreenivasan |
| 2005/0187339 A1 | 8/2005 | Xu et al. |

(Continued)

*Primary Examiner* — Tabassom Tadayyon Eslami
(74) *Attorney, Agent, or Firm* — Canon U.S.A., Inc., IP Division (57) ABSTRACT

A method and system for optimizing forces applied to actuators during a nanoimprint lithography process is provided. A first set of forces within a first set of force limits is selected to be applied to edges of a template. A first residual distortion representative of a first predicted overlay error associated with a simulated imprinting method in which the first set of forces are applied to the edges of the template is estimated. A second set of forces is selected within a second set of force limits to be applied to the edges of the template. A second residual distortion is estimated that is representative of a second predicted overlay error associated with the simulated imprinting method in which the second set of forces are applied to edges of the template. An initial set of forces having a narrowest set of force limits and residual distortion that is below a residual threshold from among the first set of forces and the second set of forces is selected.

13 Claims, 7 Drawing Sheets

(56) References Cited

U.S. PATENT DOCUMENTS

| | | | | |
|---|---|---|---|---|
| 2010/0102470 A1* | 4/2010 | Mokaberi | ............... | B82Y 10/00 264/40.5 |
| 2014/0367874 A1* | 12/2014 | Yamamoto | ............ | G03F 7/0002 264/293 |
| 2016/0144553 A1* | 5/2016 | Kobayashi | ........... | G05B 19/182 425/150 |
| 2019/0033708 A1* | 1/2019 | Cherala | ................. | G03F 9/7073 |

* cited by examiner

APPARATUS AND METHOD FOR OPTIMIZING ACTUATOR FORCES

TECHNICAL FIELD

The disclosure relates to a control system in nanoimprint lithography, more specifically to a system that controls forces to be applied by actuators during an imprint lithography process.

BACKGROUND

In nanoimprint lithography, the goal is to transfer a pattern of an imprint template to a corresponding field on a substrate. To achieve this, curable liquid resist is dispensed on the substrate and the template is caused to contact the substrate so that, after a curing process, the pattern on the template is transferred to a particular field on the substrate. In order to facilitate this process, forces are applied to the template by actuators in order to modify the template shape which helps reduce the difference in shape between the template and the substrate.

This distortion occurs using a plurality of actuators that apply forces at the edges of the template. The forces applied to each actuator are simultaneously used to correct a first set of distortion errors that are used to correct a set of distortion parameters during a closed loop alignment correction processing and a second set of distortion parameters different from the first set of distortion parameters referred to as residual overlay errors. As a result, at any given time, the forces exerted by each of the actuators is the sum of the force required for alignment correction and the force required for residual error correction.

One manner of determining the force for each actuator that can be used to correct the residual overlay error makes use of a constrained linear least squares optimization with a goal of minimizing an amount of force to be applied by each actuator to correct the residual errors. However, there is drawback associated with this approach when the calculated residual force amount is combined with the amount with the forces to be applied during alignment control and correction. More specifically, this combination frequently results in respective actuators being saturated which means the force being applied to the respective actuator has reached its maximum allowable force or minimum allowable force limit. The result of saturation adversely affects the alignment control and correction process leading to degraded overlay processing and also results in slippage of the imprint template that may impact other aspects of the imprint lithography processing. Therefore, there is a need to optimize forces used for residual error correction.

SUMMARY

According to present disclosure, a method and system for optimizing forces applied to actuators during a nanoimprint lithography process by selecting a first set of forces within a first set of force limits to be applied to edges of a template; estimating a first residual distortion that is representative of a first predicted overlay error associated with a simulated imprinting method in which the first set of forces are applied to the edges of the template; selecting a second set of forces within a second set of force limits to be applied to the edges of the template; estimating a second residual distortion that is representative of a second predicted overlay error associated with the simulated imprinting method in which the second set of forces are applied to edges of the template; and selecting an initial set of forces which has narrowest set of force limits and residual distortion that is below a residual threshold from among the first set of forces and the second set of forces.

In one embodiment, the residual distortion is a statistical metric of a set of predicted overlay error values wherein the statistical metric is one of: a standard deviation; a range; a maximum value; a mean; and a median.

In another embodiment, the second force limits are within the first force limits, the second residual distortion is higher than the first residual distortion, the second residual distortion is less than the residual threshold, and the initial set of forces is the second set of forces.

In a further embodiment, the second set of forces is selected as the initial set of forces when the second residual distortion is within a repeatability tolerance of the first residual distortion or higher than the first residual distortion.

In another embodiment, a film is imprinted on the field using the initial set of forces and which includes adjusting the initial set of forces within widest of the first set of forces limits and the second set of force limits in response to alignment signals received while imprinting the film.

In another embodiment, the residual distortion is relative to a desired distortion of the template based on measured or predicted substrate distortions in a substrate to be imprinted by the template.

In yet another embodiment, the first set of forces limits is widest set of force limits that would be used during imprinting, the residual threshold is sum of the first residual distortion and a tolerance threshold and the initial set of forces is the second set of forces when the second residual distortion is less than the residual threshold.

In a further embodiment, the first set of forces limits is wider than the second set of force limits and the residual threshold is sum of the first residual distortion and a tolerance threshold and the initial set of forces is the second set of forces when the second residual distortion is less than the residual threshold.

The details of one or more implementations of the subject matter described in this specification are set forth in the accompanying drawings and the description below. Other potential features, aspects, and advantages of the subject matter will become apparent from the description, the drawings, and the claims.

DETAILED DESCRIPTION

Figure 1:
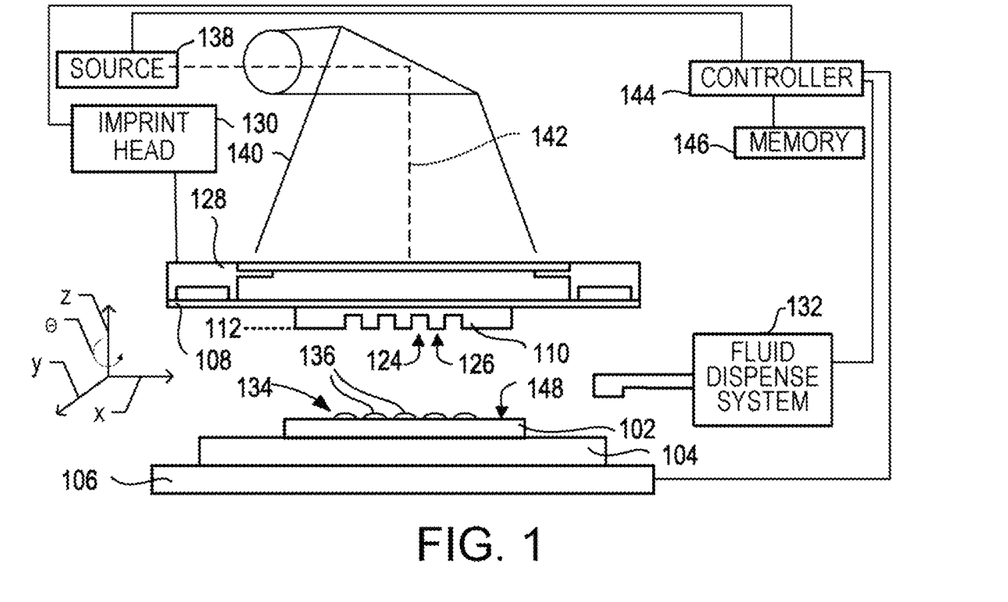
FIG. 1 depicts a side view of a nanoimprint lithography system.

FIG. 1 illustrates an imprint lithography system 100 that forms a relief pattern on a substrate 102. The substrate 102 may be coupled to a substrate chuck 104. In some examples, the substrate chuck 104 includes a vacuum chuck, a pin-type chuck, a groove-type chuck, an electromagnetic chuck, or other appropriate chuck. Exemplary chucks are described in U.S. Pat. No. 6,873,087, which is hereby incorporated by reference herein. The substrate 102 and the substrate chuck 104 may be further supported by a stage 106. The stage 106 provides motion about the x-, y-, and z-axes as well as rotation (e.g., θ) about the z-axis. In this regard, the stage 106 may refer to an XYθ stage. The stage 106, the substrate 102, and the substrate chuck 104 may also be positioned on a base (not shown).

The imprint lithography system 100 includes an imprint lithography template 108 that is spaced apart from the substrate 102. In some examples, the template 108 includes a mesa 110 (mold 110) that extends from the template 108 toward the substrate 102. In some examples, the mold 110 includes a patterning surface 112. The template 108 and/or the mold 110 may be formed from such materials including, but not limited to, fused-silica, quartz, silicon, organic polymers, siloxane polymers, borosilicate glass, fluorocarbon polymers, metal, hardened sapphire, or other appropriate material. In the illustrated example, the patterning surface 112 includes a plurality of features defined by spaced-apart recesses 124 and protrusions 126. The pattern being formed as described above is for purposes of example only and any type of pattern may be represented on the patterning surface 112. As such, the patterning surface 112 may define any pattern that forms the basis of a pattern to be formed, via imprint processing, on substrate 102.

The template 108 may be coupled to a template chuck 128. In some examples, the template chuck 128 includes a vacuum chuck, a pin-type chuck, a groove-type chuck, an electromagnetic chuck, or any appropriate chuck. Exemplary chucks are described in U.S. Pat. No. 6,873,087. In some embodiments, the template chuck 128 may be of the same type as the substrate chuck 104. In other embodiments, the template chuck 128 and substrate chuck may be different types of chucks. Further, the template chuck 128 may be coupled to an imprint head 130 such that the template chuck 128, the imprint head 130, or both are configured to facilitate movement of the template 108. Movement of the template 108 includes movement in the plane of the template (in-plane movement) and movement out of the plane of the template (out-of-plane movement) with respect to the template. In-plane movement includes translation of the template 108 in the plane of the template (e.g., in the X-Y plane as depicted in FIG. 1) and rotation of the template in the plane of the template (e.g., in the X-Y plane and about the Z axis). Translation or rotation of the template 108 with respect to the substrate 102 may also be achieved by translation or rotation of the substrate. In-plane movement of the template 108 also includes increasing or decreasing a compression force on opposite sides of the template (e.g., with a magnification actuator) to increase or decrease dimensions of the template in the X-Y plane of the template. Mechanisms and control for applying and adjusting forces will be described below with respect to FIGS. 3-10. Out-of-plane movement of the template 108 includes translation of the template along the Z-axis (e.g., to increase or decrease a force applied to the substrate via the template by increasing or decreasing the distance between the template and the substrate) and rotation of the template about an axis in the X-Y plane of the template. Rotation of template 108 about an axis in the X-Y plane of the template changes an angle between the X-Y plane of the template 108 and the X-Y plane of substrate 102, and is referred herein to as "tilting" the template with respect to the substrate, or changing a "tilt" or "tilt angle" of the template with respect to the substrate. U.S. Pat. No. 8,387,482 discloses movement of a template via an imprint head in an imprint lithography system and is incorporated by reference herein.

The imprint lithography system 100 may further include a fluid dispense system 132. The fluid dispense system 132 may be used to deposit a polymerizable material 134 on the substrate 102. The polymerizable material 134 may be disposed on the substrate 102 using techniques such as drop dispense, spin-coating, dip coating, chemical vapor deposition (CVD), physical vapor deposition (PVD), thin film deposition, thick film deposition, or other appropriate method. In some examples, the polymerizable material 134 is disposed on the substrate 102 before or after a desired volume is defined between the mold 110 and the substrate 102. The polymerizable material 134 may include monomers as described in U.S. Pat. No. 7,157,036 and U.S. Patent Application Publication No. 2005/0187339, both of which are incorporated by reference herein. In some examples, the polymerizable material 134 is disposed on the substrate 102 as a plurality of droplets 136.

Figure 2:
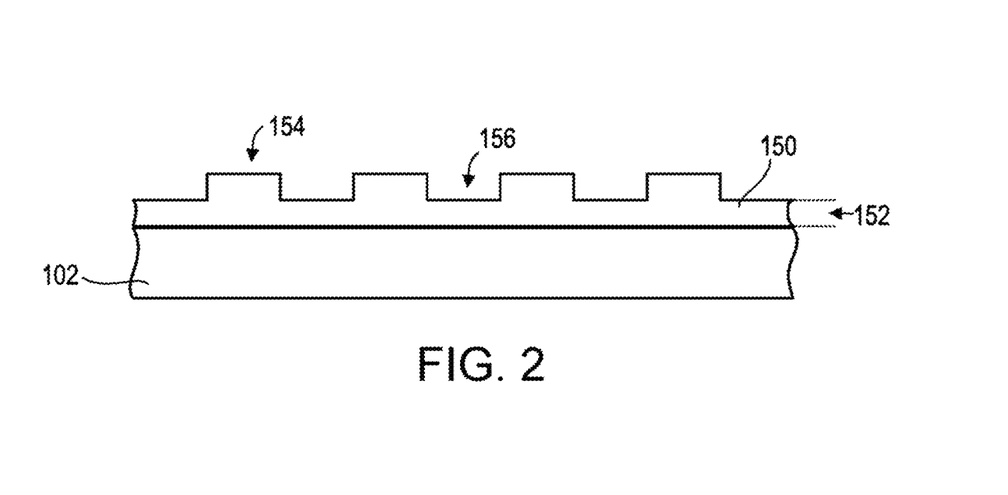
FIG. 2 depicts a side view of the substrate of FIG. 1.

Referring to FIGS. 1 and 2, the imprint lithography system 100 may further include an energy source 138 coupled to direct energy 140 along a path 142. In some examples, the imprint head 130 and the stage 106 are configured to position the template 108 and the substrate 102 in superimposition with the path 142. The imprint lithography system 100 may be regulated by a controller 144 in communication with the stage 106, the imprint head 130, the fluid dispense system 132, the energy source 138, or any combination thereof, and may operate on a computer readable program stored in a memory 146.

In some examples, the imprint head 130, the stage 106, or both, vary a distance between the mold 110 and the substrate 102 to define a desired volume therebetween that is filled by the polymerizable material 134. For example, the imprint head 130 may apply a force to the template 108 such that the mold 110 contacts the polymerizable material 134. After the desired volume is filled by the polymerizable material 134, the energy source 138 produces energy 140, such as broadband ultraviolet radiation, causing the polymerizable material 134 to polymerize and to conform to the shape of a surface 148 of the substrate 102 and the patterning surface 112, defining a polymeric patterned layer 150 on the substrate 102. In some examples, the patterned layer 150 includes a residual layer 152 and a plurality of features shown as protrusions 154 and recessions 156, with the protrusions 154 having a thickness t1 and the residual layer 152 having a thickness t2.

The above-described system and process may be further implemented in imprint lithography processes and systems referred to in U.S. Pat. No. 6,932,934, U.S. Patent Application Publication No. 2004/0124566, U.S. Patent Application Publication No. 2004/0188381, and U.S. Patent Application Publication No. 2004/0211754, all of which are incorporated by reference herein.

Imprint lithography substrates and templates may include corresponding pairs of alignment marks that allow real-time alignment of the template and the substrate. After the patterned template is positioned over the substrate (e.g., superimposed over the substrate), an alignment of the template alignment marks with respect to the substrate alignment marks is determined. Alignment schemes may include "through the mesa" (TTM) measurement of alignment errors associated with pairs of corresponding alignment marks, followed by compensation of these errors to achieve accurate alignment of the template and a desired imprint location on the substrate as disclosed in U.S. Pat. Nos. 6,916,585; 7,170,589; 7,298,456; and 7,420,654, all of which are incorporated by reference herein. Alignment errors may be caused by relative positioning of the substrate and the template, deformation of the substrate or the template, or a combination thereof. Alignment errors may also be caused by the introduction of vibration caused by one or more actions of the imprint lithography process and machinery that executes imprint lithography processes.

Figure 3:
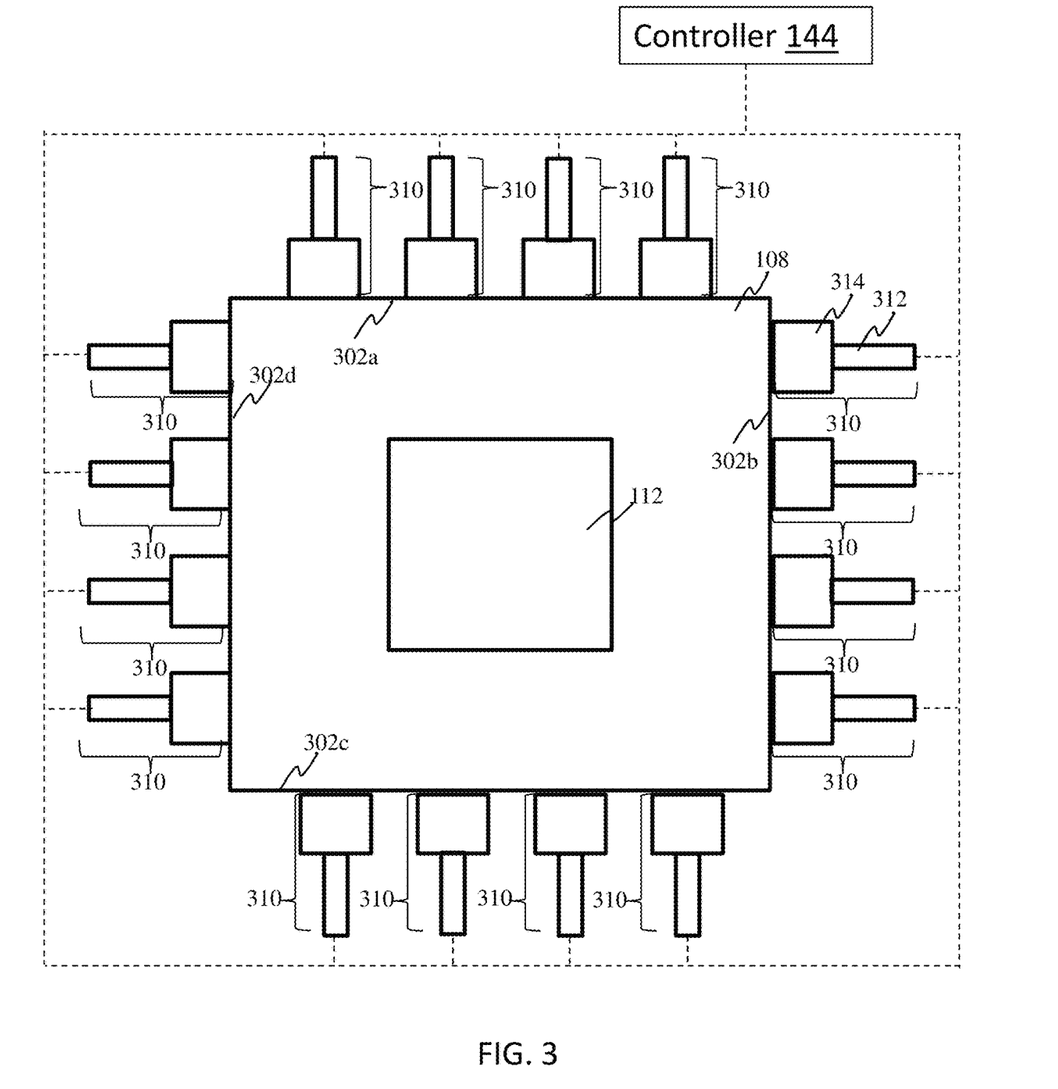
FIG. 3 depicts a configuration of deformation mechanisms.

FIG. 3 illustrates exemplary deformation mechanisms 310 and control system that selectively determines and applies control values that are sent, communicated or otherwise transmitted to each respective deformation mechanism 310 of the plurality of deformation mechanisms. These control signals cause the respective deformation mechanisms 310 to apply and modify compressive forces applied to the template 108 shown in FIG. 1 such that an imprint pattern 112 can form a better fit with the substrate 102 and transfer the imprint pattern 112 thereto. The deformation mechanism 310 may deform the pattern area 112 of the template 108 by applying forces to four side surfaces 302a-302d of the template 108. As shown herein, this exemplary embodiment includes 16 deformation mechanisms 310. Each respective deformation mechanism 310 includes an actuator 312 connected to a contact portion 314 wherein the contact portion 314 contacts at least a portion of a template side 302a-302d adjacent thereto. Each of the deformation mechanisms 310 are connected to the controller 144 (illustrated by the dashed lines). The controller 144 executes at least one control algorithm that selectively determines an amount of force to be applied by each of the individual deformation mechanisms 310 to the sides 302a-302d of the template 108 in order to modify the shape thereof.

The controller 144, as shown in FIG. 1, includes at least one central processing unit (CPU) and memory and can execute instructions stored in the memory to perform one or more of the described operations and/or functions. The controller 144 is in communication with one or more memories (e.g., RAM and/or ROM) and, in some instances executes stored instructions to perform the one or more control operations. In other instances, the controller 144 may temporarily store data in the one or more memories that are used in calculation and generation of the various signals described hereinafter. As such, the controller 144 controls the system 100 of FIG. 1 by using a computer program (one or more series of stored instructions executable by the CPU) and data stored in the RAM and/or ROM. Here, the controller 144 may include (or may be in communication with) one or more dedicated hardware or a graphics processing unit (GPU), which is different from the CPU, and the GPU or the dedicated hardware may perform a part of the processes by the CPU. As an example of the dedicated hardware, there are an application specific integrated circuit (ASIC), a field-programmable gate array (FPGA), and a digital signal processor (DSP), and the like. In some embodiments, the controller 144 may be a dedicated controller. In others, the control system 100 may include a plurality of controllers that are in communication with one another and other components of the control system 100 to implement the operations described herein.

The connection between the controller 144 and each of the deformation mechanisms 310 enables one or more control signals (time series of control values) to be communicated to the respective deformation mechanisms 310 which control the actuators 312 to apply various levels of force to the sides 302a-302d via respective contact portions 314. These control signals may be sent, transmitted, or otherwise communicated to each of the deformation mechanisms 310 via a wired or wireless communication pathway. The actuator 312 drives the contact portion 314 to cause force to be applied to a portion of the side of the template 108 adjacent thereto. While illustrated herein as two separate components, the actuator 312 and contact portion 314 may be formed integral with one another. The actuator 312 part of the deformation mechanism 310 may be any actuation mechanism including but not limited to pneumatic, piezoelectric, magnetostrictive, and voice coils. In one embodiment, the deformation mechanisms 310 are mounted to a frame and linked together via a linkage system such that control signals can be provided to the linkage system for controlling the movement and operation of the deformation mechanisms 310.

Exemplary control algorithms include those which cause the deformation mechanism 310 to operate as a correction mechanism that physically deforms the template 108 by applying external forces from sides 302a-302d of the template 108. By applying these forces, a shape of the pattern area 112 is corrected such that a difference between the shape of the pattern (shot area) formed on the substrate and the shape of the pattern area 112 can be reduced. Thus, overlay accuracy of the pattern formed on the substrate and the pattern of the imprint material newly formed on the substrate can be improved. Exemplary components of the shape (including the size) of the pattern area 112 that can be controlled by the deformation mechanism 310 may include, for example, a magnification component, and a distortion component (for example, a component having a rhombic shape, a trapezoidal shape, or the like, or a component having a higher order).

It should be noted that the illustration of 16 deformation mechanisms as shown in FIG. 3 is done for purposes of example only and merely illustrates one possible embodiment. In other embodiments there may be N number of deformation mechanisms 310 where N is at least two. The number of deformation mechanism used may be determined based on the size of template and amounts of force desired to be applied to the various sides of the template. In one embodiment, there are an equal number of deformation mechanisms 310 on each side 302a-302d of template 108.

During the imprint process, the forces applied by each deformation mechanism 310 are used for first control and correction processing and secondary control and correction processing. First control and correction processing includes alignment and control processing as noted above to ensure that the template is properly aligned with the substrate to allow for the pattern on the template to be applied to the substrate by lithography imprinting. Secondary control and correction processing includes determining further forces to be applied by each deformation mechanism 310 to correct for any residual overlay errors not corrected by the first control and correction processing. The determined forces for each deformation mechanism are aggregated and used to deform the template to improve position and fit of the template vis-a-vis the substrate.

The distortion components to be corrected by the first control and correction processing and the second control and correction processing in the x and y direction represented generally by the following equation (1):

$$e_x = k_{1x} + k_{2x}X + k_{3x}Y + k_{4x}XY + k_f{}^*f_x + k_{tiltx}{}^*t_{xx} + k_{tilty}{}^*t_{yx} + \epsilon_x$$

$$e_y = k_{1y} + k_{2y}Y + k_{3y}Y + k_{4y}YX + k_f{}^*f_y + k_{tilty}{}^*t_{yy} + k_{tiltx}{}^*t_{xy} + \epsilon_y \qquad (1)$$

where
- $e_x$ is the overlay error in X direction and $e_y$ is the overlay error in the Y direction, and
    - $k_{1x}$ is the Shift in the X direction; $k_{2x}$ is the Magnification in the X direction; $k_{3x}$ is the Skew in the X direction; $k_{4x}$ is the Trapezoidal correction in the X direction;
- $k_{1y}$ is the Shift in the Y direction; $k_{2y}$ is the Magnification in the Y direction;
- $k_{3y}$ is the Skew in the Y direction; $k_{4y}$ is the Trapezoidal correction in the Y direction;
- $k_f$ is the Final Imprint force value; $k_{tiltx}$ is the Tilt X direction; and $k_{tilty}$ is the Tilt in the Y direction. These comprise a first set of distortion components otherwise known as low order distortion components. In the above equation, there is a second set of distortion components otherwise known as high order distortion components and they are $\epsilon_x$ which represents the residual error in the x direction and $\epsilon_y$ which represents the residual error in the Y direction. In an embodiment, the second set of distortion could also include some portion of the lower order components of overlay such as magnification, skew, and trapezoidal errors in addition to the high order distortion components.

Typically, the first control and correction processing uses a combination of real-time feedback and feed forward closed loop processing to correct for the first set of distortion components whereas the second control and correction processing are used to correct for the second set of distortion components. Typically, these second set of distortion components are not measured and actively corrected in real-time and an estimate of these overlay distortions are obtained in prior test experiments where the second set of distortions are not corrected. An estimate of these distortions are then obtained from the overlay data measured on those test substrates using a measurement tool such as an Archer™ tool (KLA Corporation, Milpitas, CA). Moreover, as the estimates are obtained from prior test wafers, these correction forces can be determined prior to imprinting on device substrates and are applied as feed forward for each imprint field on the substrates. In another embodiment, with the additional of sufficient numbers of measurement tools able to measure a number of fields on a substrate, the estimates described above may be measured in real time as well. Exemplary alignment processing algorithms are described in U.S. Pat. Nos. 7,828,984, 8,845,317, 9,579,843 and 9,573,319 all of which are incorporated herein by reference and closed loop control processing are described in U.S. Pat. Nos. 10,635,072 and 10,216,104, all of which are incorporated herein by reference.

The algorithms described herein, when executed during the imprint lithography process advantageously optimize the magnitudes of force at each deformation mechanism used to correct for the second set of distortion parameters (residual errors) thereby increasing a range of force available for use to correct the first set of distortion parameters. This is advantageous because a problem associated with correcting for residual overlay occurs due to the relatively high magnitude of force required to correct the residual overlay error which can lead to respective ones of each of the deformation mechanisms 310 reaching their force saturation point (either maximum force or minimum force levels). This results in a smaller range of force able to be used for the alignment correction and control provided to correct for the first set of distortion parameters (e.g. low order distortion components).

In order to optimize the forces to be used to correct the residual overlay errors to make available additional force to be used as part of the closed loop alignment and correction control processing, the presently described optimization algorithm iterates (or sweeps) through a range of available forces within a predetermined ranges of forces for each deformation mechanism 310. This iteration is done on a per field basis where the field is the area on the substrate on which imprinting will occur. Outside of the predetermined range of force that each deformation mechanism 310 may use to correct residual overlay error, there are a lower force range and upper force range which are used for alignment and control processing. The lower force range begins at the lowest force value of the predetermined range of forces and approaches zero whereas the upper for face begins at the highest force value of the predetermined range of forces. The total force range available to a respective deformation mechanism begins at the lowest force value in the lower force range and ends at the highest force value of the upper force range thereby including the lower force range, the predetermined force range, and the upper force range. The force optimization algorithm advantageously iterates through the force ranges for each distortion mechanism to be applied to a particular imprint field to correct the target second set of distortions and to compute the residual values at each force limit to identify and select the optimal minimum-maximum force range which achieves the residual values that is within a predetermined tolerance value. In one embodiment, the residual value using the optimal minimum to maximum force range is within a tolerance threshold of the residual value obtained within the initial minimum to maximum force range. As used herein comparing the residual values or comparing the difference of residual values to a threshold refers to a statistical metric of the residual error distribution. In one embodiment, the statistical metric is the standard deviation (or 3 times standard deviation) but it can also be other statistical metrics such as variance, range, mean, median, maximum value. For each imprint field a set of outliers are measured, residuals are calculated for each outlier forming a set of outliers, and then a statistical metric of that set of outliers. The statistical metric may be a statistical metric or a function of one or more statistical metrics such as the mean plus 3 times the standard deviation. By minimizing the forces needed for overlay correction, there is an expansion of available forces that can be utilized and applied during the alignment control and correction processing on the particular field for correction of first set of distortions.

The optimization algorithm described herein are executed by the controller 144 shown in FIGS. 1 and 3. Each controller 144 may comprise a series of stored instructions that are executed by the CPU of controller 144 to perform the described functions. In other embodiments, each controller described herein may be embodied as individual integrated circuits each with their own CPUs and memories and are dedicated to performing the processing associated therewith. In other embodiments, one or more of the controllers described herein may be embodied as a single integrated circuit. Further, in some embodiments, some of the described controllers may be dedicated processing units and be in communication with the CPU of the controller which is executing stored instructions to complete the function operations described herein.

Figure 4A:
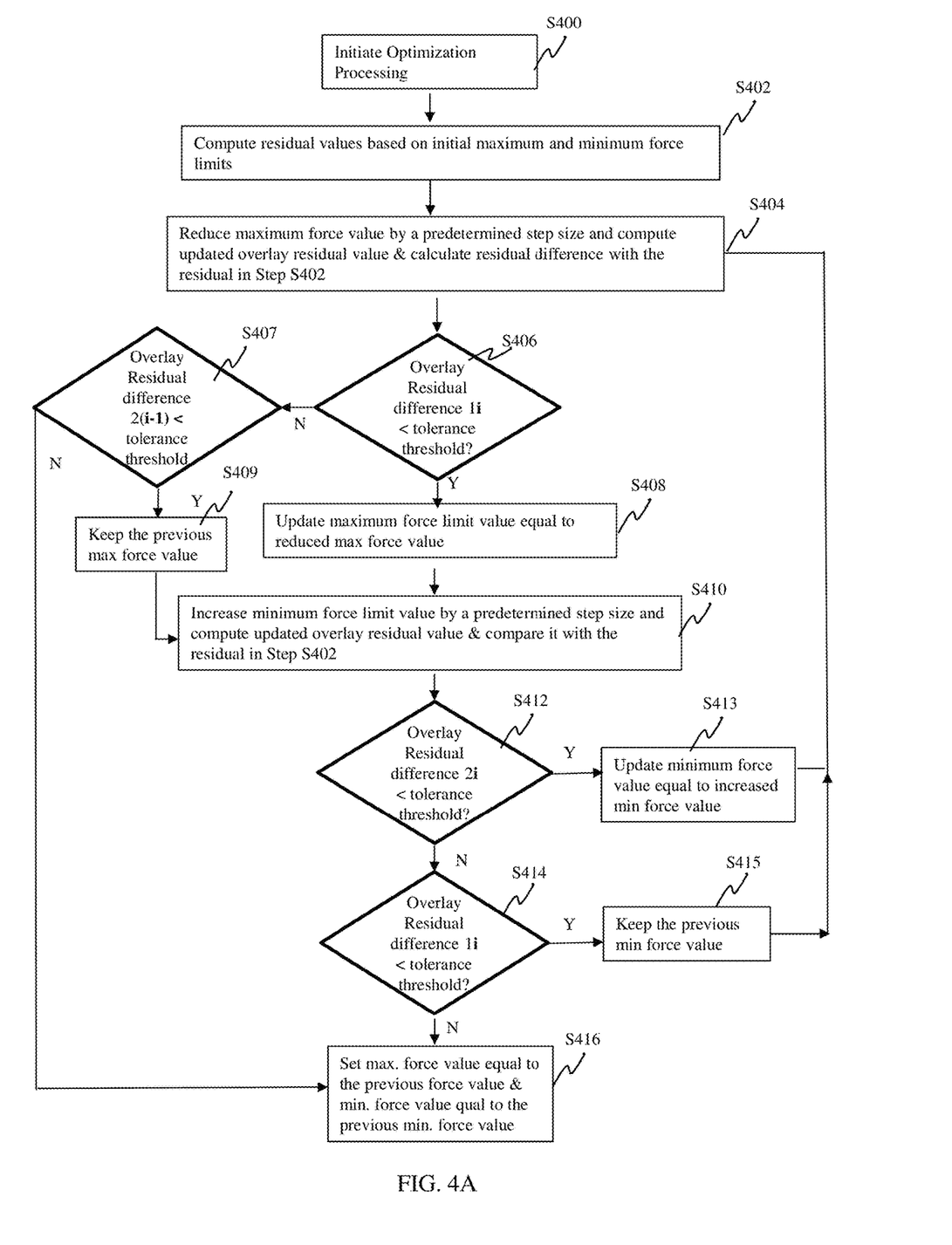
FIGS. 4A & 4B are flow diagrams of force optimization algorithms.

In step S400, optimization processing begins and is performed for each of the respective deformation mechanisms 310 and for each individual field on a substrate that is to be imprinted during a lithography imprint process. In step S402 residual overlay values, $\varepsilon_x$ and $\varepsilon_y$ are computed based on an initial maximum force and minimum force value using an initial optimization method. This initial minimum to maximum force range could span across the entire force range available on each deformation mechanism 310. More generally, the initial minimum to maximum force range spans across majority of the force range available on each deformation mechanism 310. In one embodiment, the initial optimization method is executed such that the residual overlay values calculated in S402 is performed based on the following equation (2):

$$\text{Find } C_{Mag} \text{ \& } C_{heat} \text{ to minimize } (\varepsilon_x, \varepsilon_y) \quad (2)$$

$$\begin{bmatrix} \varepsilon_x \\ \varepsilon_y \end{bmatrix} = \begin{bmatrix} T_x \\ T_y \end{bmatrix} - \begin{bmatrix} A_{Mag_x} & A_{heat_x} \\ A_{Mag_y} & A_{heat_y} \end{bmatrix} \begin{bmatrix} C_{Mag} \\ C_{heat} \end{bmatrix}$$

while satisfying the contraints :

$$F_{min} \leq C_{Mag} \leq F_{max} \text{ \& } C_{heat\,min} \leq C_{heat} \leq C_{heat\,max}$$

where, $T_x$ & $T_y$ (in nm) are the higher order distortion component (second set of distortions) of the overlay in the x and y directions at a predetermined number of measurement points, m. $A_{MagX}$ & $A_{MagY}$ (nm/N) are the transformation matrices that transform the deformation mechanism actuator forces, $C_{mag}$ (N) into template distortion (in nm) along X and Y axis, respectively. $A_{heatX}$ & $A_{heatY}$ are the transformation matrix that convert the heating power density, $C_{heat}$ (W/m$^2$) into wafer/substrate overlay distortion (nm). The target distortions, $T_x$ & $T_y$ (in nm) are the second set of distortions obtained from the overlay measured on prior test substrates where the second set of distortions have not been corrected. In another embodiment, with the use of additional measurement tools, these measurements can occur in real-time. These target distortions can vary from field to field on an imprint substrate and hence, different solutions are computed for each field. The objective of the above regression/optimization is to find the effort vectors $C_{Mag}$ (N) and $C_{heat}$ (W/m2) within their constraints $F_{min}$ to $F_{max}$ and $C_{heat\,min}$ to $C_{heat\,max}$, that minimize the residuals $\varepsilon_x$ and $\varepsilon_y$ on each field. Where $\varepsilon_x$ and $\varepsilon_y$ represent the overlay errors that remain uncorrected by this high order distortion correction mechanism. For purposes of this disclosure the relevant values used by the presently described optimization algorithm are $F_{min}$ to $F_{max}$ and these values are obtained based on a last final force values of the respective deformation mechanism 310 in a prior test run where the second set of distortions are not corrected.

Figure 5A:
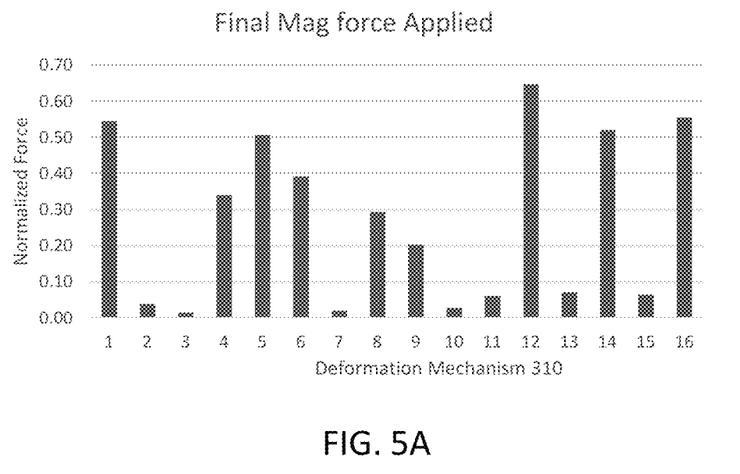
FIGS. 5A & 5B are graphical representation of force values applied by respective deformation mechanisms.
Figure 5B:
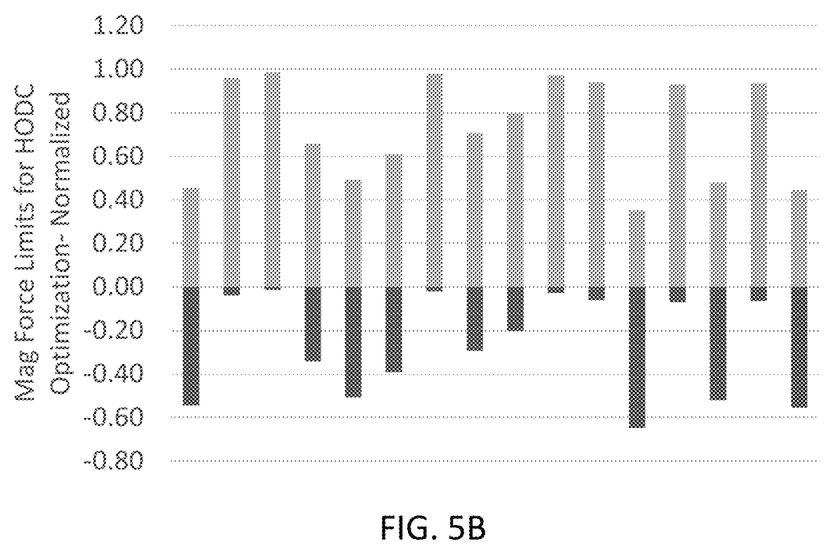

FIGS. 5A and 5B graphically illustrate aspects of the of the computation in step S402 whereby FIG. 5A illustrates each of the sixteen respective deformation mechanisms on the x-axis and a respective final force to be applied by each of the respective deformation mechanisms to the substrate in a run where the high order distortions are not corrected as shown on the y-axis (normalized to the force range). From this, the plot shown in FIG. 5B can be computed which illustrates the range of forces available to each of the respective deformation mechanisms that are available to correct other distortions such as high order distortion. The initial minimum and maximum force limits for each finger, $F_{min}$ & $F_{max}$ for the optimization are calculated by subtracting the forces for the corresponding fingers in FIG. 5A from the minimum and maximum force range available for each correction mechanism. This would generally imply that the initial minimum to maximum force range would be the widest force range that can be used for correcting the second set of distortions in the process. Using these force limits, the equation (2) is solved and the residuals ($\varepsilon_x$, $\varepsilon_y$) are determined. This represents the least squares residual estimate but it is not the most efficient, from an actuator force utilization perspective, because the input effort utilization may not be as efficient as it could be. This is important because, as noted above, the hardware (e.g. deformation mechanisms) are shared between high order distortion correction and the dynamic alignment control and correction functionality (e.g. closed loop control of lower order errors).

As a result of S402, the overlay residual is computed using initial maximum and minimum force values—that span across the full force range available for the actuators and then the force limit range is further optimized by S406-S416 to find an efficient force range that balances the force utilization with overlay correction. In step S404, the maximum force limit used in S402 is reduced by a predetermined step size. In one embodiment the predetermined step size is a force value ranging of 1 N to 5 N. For example, in S404, the initial Fmax value computed in S402 is reduced by a predetermined size of 5 N and the overlay residual values $\varepsilon_x$ and $\varepsilon_y$ are recalculated to determine if the recalculated residuals are within a predetermined tolerance threshold of the overlay residuals in step S402. In other words, the difference between the residuals with a wider initial force range and the residuals with a tighter force range is computed and a statistical metric such as 3*standard deviation of the difference values, is obtained from the difference which is then compared against the predetermined tolerance threshold. The predetermined tolerance threshold is a distance in nanometers that would be acceptable as an overlay error such that, by reducing the maximum force, the resulting correction would still allow for an acceptable overlay error while increasing an amount of force available to other correction mechanisms such as alignment control and correction. In another embodiment, the recalculated residuals are determined to be within a predetermined tolerance threshold representing the absolute overlay residual.

In one embodiment, the predetermined tolerance is based on the repeatability of the overlay in the nanolithography imprint process. The tolerance threshold ($\Delta$) can be determined (or set) according to the following:

$$\Delta = k*((\text{Tool+Process+Overlay metrology})\text{repeatability measure})$$

where generally, $0 \leq k \leq 1$

In one exemplary embodiment, the tolerance threshold represents an acceptable residual of 0.05 nm, 0.1 nm, 0.2 nm. In another embodiment, the tolerance threshold may be based on a percentage of the target overlay budget. For example, the tolerance threshold may be less than or equal to 10% of the total overlay error variance. In an exemplary embodiment where the overlay error budget is $3\sigma=2$ nm (3 standard deviations of the overlay errors in the devices) and the tolerance threshold ($\Delta$) for this optimization is set as 10% of the overlay error variance, the threshold is determined accordingly as:

$$\Delta^2 \leq \frac{1}{10} * \left(\frac{2}{3}\right)^2 \Rightarrow \Delta \leq 0.21 \text{ nm} \quad (23)$$

As such, step S404 computes the updated residual values and determines if the difference between the updated residual value and original residual value is less than the predetermined threshold tolerance value as shown in step S406. If the difference between the updated residual value from S404 and original residual value in S402 is less than (or equal to) the tolerance threshold (e.g., TRUE), the value of Fmax is updated to the reduced force value as in S408 and proceeds to S410 described below. In the instance that the determination in S406 indicates the difference between the updated residual value from S404 and original residual value S402 is not less than the tolerance threshold (e.g., FALSE), the algorithm proceeds to S407 where a further decision is made as to whether the overlay residual difference from Step 412 in the previous iteration is less than the tolerance threshold. In S407, the value subject to the determination is the overlay residual difference from S412 as taken from the output of S410 in the previous iteration (denoted as i-1 in the flow chart). If the determination in S407 is negative then the algorithm proceeds to S416 and sets Fmax value equal to the previous max force value and sets Fmin to the previous minimum force value. If the determination in S407 is positive then, in S409, the value of Fmax is kept at the previous Fmax value determined (which could also be the value determined in S402 for the first iteration) and then proceeds to S410.

In S410, the algorithm obtains the minimum force value computed in S402, Fmin, and increments up the minimum force value by a predetermined step size. In one embodiment the predetermined step size is a force value ranging from 1 N to 5 N. For example, in S410, the initial Fmin value computed in S402 is increased by a predetermined size of 5 N and the residual values $\varepsilon_x$ and $\varepsilon_y$ are recalculated to determine if the recalculated residuals are within a predetermined tolerance threshold of the original residual values calculated in Step S402. The recalculation of the residuals performed in S410 may be based on the updated Fmax value as set in S408 or using the previous Fmax value as set in S409.

In step S412, a further comparison of the updated residual values calculated in S410 are compared to the tolerance threshold as described in S406. If the difference between the updated residual value from S410 and original residual value in S402 is less than (or equal to) the tolerance threshold (e.g., TRUE), the value of Fmin is updated to the increased force value as in S413 and reverts back to S404 in order to perform another optimization iteration to see if the values of Fmax and Fmin can be further decreased and increased, respectively. In the instance that the determination in S412 indicates the difference between the updated residual value from S410 and original residual value S402 is greater than the tolerance threshold (e.g. FALSE), a further decision, in S414, is made to determine if the overlay residual difference from Step 406 in the same iteration, is less than the tolerance threshold (e.g. the inquiry from S406). If the inquiry in S414 is positive (e.g. TRUE), the algorithm proceeds to S415 where the value of Fmin is kept at the previous Fmin value (which could be the value determined in S402 for the first iteration) and then reverts back to S406 to perform another optimization iteration. If the determination in S414 is negative then the algorithm proceeds to S416 and sets Fmin to the previous minimum force value and sets Fmax value equal to the previous max force value.

At such time that a determination that decrementing the Fmax value and incrementing the Fmin value results in the residual difference being above the tolerance threshold, current Fmax and Fmin values are then set, in S416, for the particular imprint field and the algorithm of FIG. 4 is repeated for a subsequent imprint field on the substrate. In other words, as soon as the overlay residual is outside the tolerance threshold of the original overlay residual in S402 for both S412 and S406, the optimization is stopped and the previous min. and max. force limit values are selected for the field. This routine enables that a minimum force range is used by the actuators for correcting second set of distortions. Thus, the present optimization algorithm advantageously improves the available force ranges that can be made available to each of the deformation mechanisms for real-time feed forward correction of distortions other than high order distortions (first set of distortions)

Figure 6:
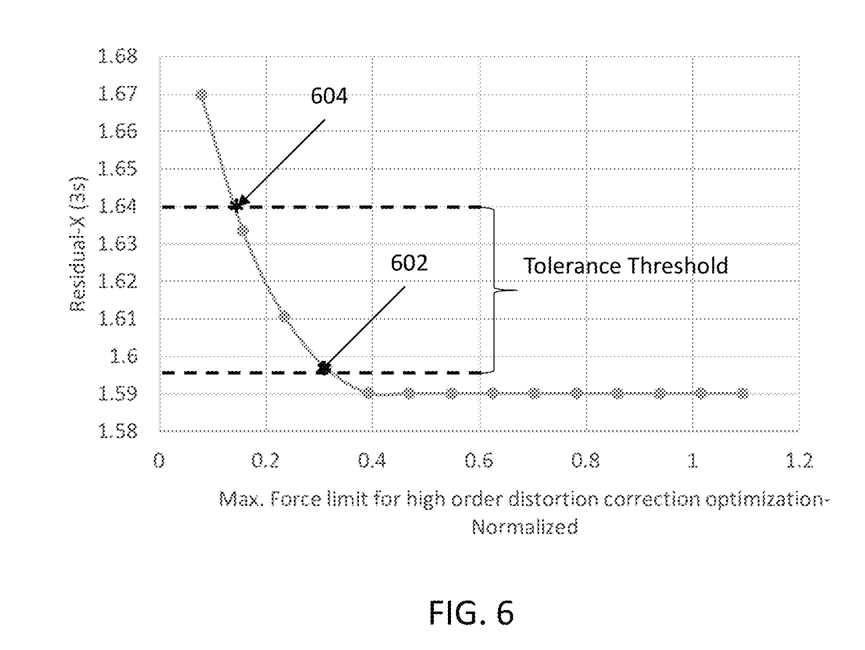
FIG. 6 is graphical illustration of the reduction in force for a particular deformation mechanism based on the optimization algorithm of the present disclosure.

The improvement provided by execution of the algorithm in FIG. 4, can be visualized when looking at the graph in FIG. 6. Therein, is an exemplary plot of residual distortions based on a determined Fmax (determined so that each deformation member can use up the maximum force range available) for the plurality of deformation members. As shown herein, the point labeled 602 indicates the 3 standard deviations of the overlay residual computed with an Fmax value that utilizes forces up to the max. force limit of the actuators according to step S402. By further improving the optimization processing by stepping down the Fmax level while keeping the overlay residual value below the tolerance threshold of the original residual (602), the resulting Fmax value can be reduced as shown by the point labeled 604. By reducing the force needed to perform high order distortion correction (correct second set of distortions) in this manner frees up available force that can be used for the low order distortion correction (first set of distortions) during real-time feedback alignment control and processing. This advantage is illustrated for a single field overlay distortion data. However, it should be understood that the determination of optimal upper and lower force limits for each field can provide distortion performance within the predetermined threshold tolerance value in nanometers.

FIG. 4A describes an algorithm that iterates to step down maximum force levels determined by the initial optimization in S404-S408 and steps up minimum force levels determined by the initial optimization in S410-S414. In another embodiment, the optimization algorithm can include either the operations performed in S404-S408 or those performed in S410-S414. In either of these embodiments, step S402 to calculate the residual with the largest force range available for the actuators/deformation mechanisms (highest Fmax, lowest Fmin allowed) precedes the above reference block so as only the maximum force is iteratively stepped down from the initial maximum force limit in S402 or that the minimum force is iteratively increased from the initial minimum force limit in S402.

In the embodiment whereby the optimization algorithm seeks to optimize the maximum force limit value (Fmax), the algorithm includes S400 S408 and S416. In this iteration, the initial Fmax value is computed in S402 and then the Fmax value is stepped down by a predetermined step value representing a predetermined force (N) and updated residual values are calculated in S404. In S406, a difference between the updated residual values and the original residual values are compared to the tolerance threshold. If the difference in residual values are less than the predetermined tolerance threshold, the stepped down value of Fmax is set as the new Fmax value. This process is repeated until the comparison in S406 yields a difference in residual values that is greater than the threshold tolerance at which point the most recent (last Fmax where the condition S406 is true) Fmax is set as the Fmax value and the algorithm is applied to the next imprint field.

In the embodiment where the optimization algorithm seeks to optimize the minimum force limit value (Fmin), the algorithm includes S400 S402 and S410-S413 and S416.

The initial Fmin value is computed in S402 and then the Fmin value is incremented up by a predetermined step value representing a predetermined force (N) and updated residual values are calculated in S410. In S412, a difference between the updated residual values and the original residual values are compared to the tolerance threshold. If the difference in residual values are less than the predetermined tolerance threshold, the incremented value of Fmin is set as the new Fmin value in S413. This process is repeated until the comparison in S412 yields a difference in residual values that is greater than the threshold tolerance at which point the most recent (last Fmin where the condition S412 is true) Fmin is set as the Fmin value and the algorithm is applied to the next imprint field.

Figure 4B:
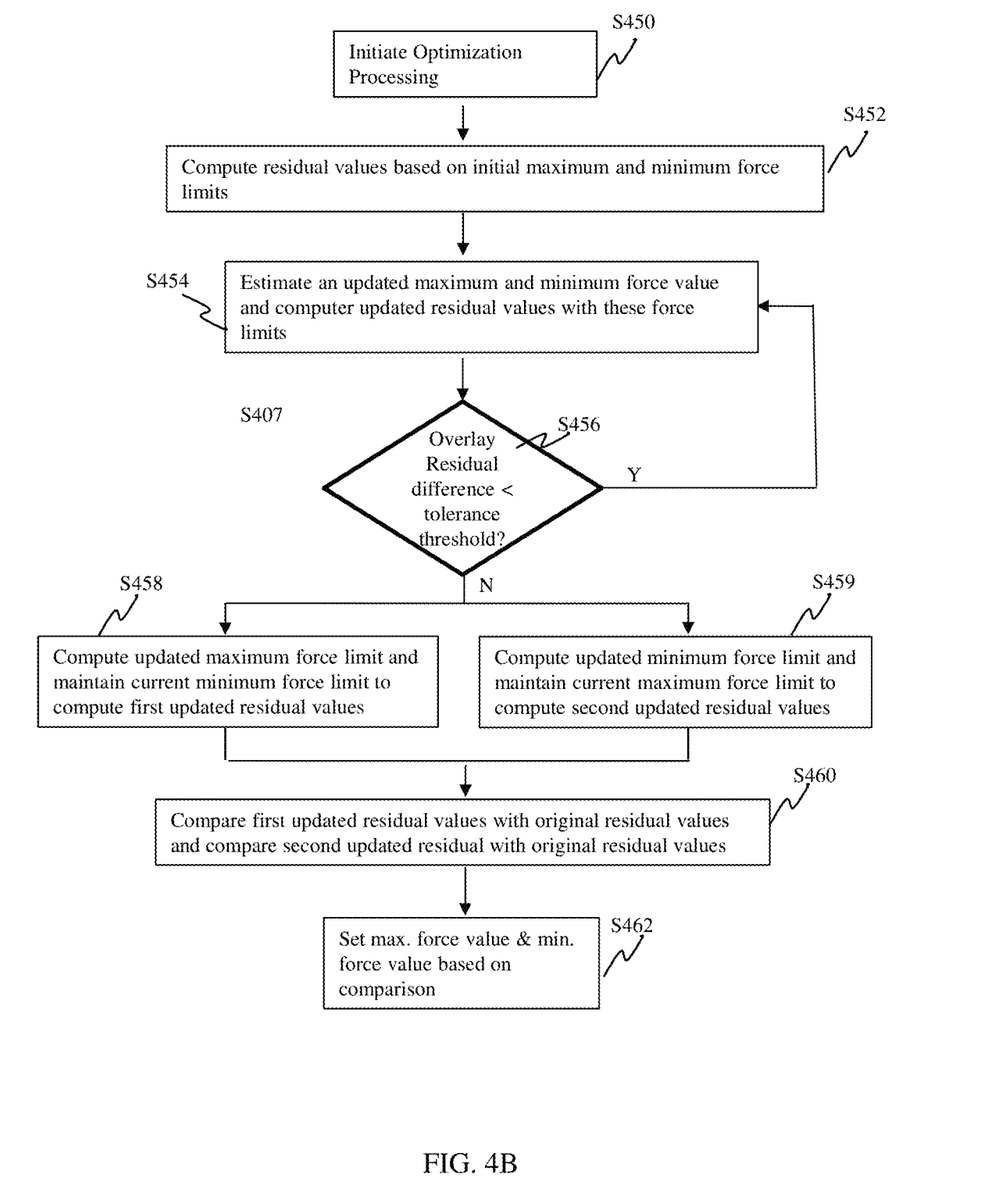

In another embodiment of the optimization algorithm shown in FIG. 4B, steps S404-S408 are performed at the same time as steps S410-S414. In this embodiment, the initial optimization processing begins at S450 and the residual values are computed in S452 which mirrors the operation discussed above in S402. In S452, the overlay residuals are obtained using the initial maximum and minimum force limit values (that span across the entire usable force range for the actuators/deformation mechanism). Once obtained, in S454, estimation processing occurs in order to estimate an updated maximum force value and an updated minimum force value. This occurs by subtracting a predetermined step size from the maximum force value and adding a predetermined step size to the minimum force value. In one embodiment, the step size subtracted and added are the same value. However, these step size values need not be the same. Subsequently, in S456, the updated residual values are computed with these force limits and if a difference of the updated residual values and the original residual values (in S452) is less than the threshold tolerance represented by a predefined value in nanometers, then the algorithm continues back to S454 and conducts its iteration of decrementing maximum force limit values and incrementing minimum force limit values in a single step. If the query in S456 indicates that the difference between the updated residual value and the original residual value is greater than the tolerance threshold, further optimization is performed in S458 to generate a first further residual value. In the first further optimization, an updated maximum force limit value is computed by adding the step size to the current maximum force value (the purpose of this is to go to the previous maximum force limit) and maintain the current minimum force value. This is used to compute the first further residual value. At the same time, in S459, a second further optimization is performed to obtain a second further residual value. To obtain the second further residual value, the current maximum force limit value is maintained and the step size is subtracted from the current minimum force value. In step 460, a comparison is made between first further residual values and the original residual value (computed with initial minimum and maximum force limit values) as well as the second further residual value and the original residual value. In S462, the maximum and minimum values of force are set based on the following outcomes. In a case where only the difference between the first further residual value and the original residual value is less than the tolerance threshold, the values maximum force value and minimum force value used to generate the first further residual values are kept and processing continues on a further imprint field. If this comparison does not yield residual difference less than the threshold, further processing is performed. In a case where only the difference between the second further residual value and the original residual value is less than the tolerance threshold, then the maximum and minimum force values used to compute the second further residual value is kept and processing continues on a further imprint field. However, if both of the above yield residual differences less than the tolerance threshold, the maximum and minimum force values that generated the smallest difference from the tolerance threshold are kept and processing continues on further imprint fields.

In another embodiment, the optimization above may be modified such that a coarse optimization is first performed and, in the case where the coarse optimization does not yield a residual difference between updated residual value and original residual value smaller than the tolerance threshold, the further optimizations described above used to generate first further residual value and second further residual values are done using step sizes that are different from the original step sizes used. By making the step sizes for initial optimizations coarser than later optimizations with finer step sizes, there is a likely reduction in iterations through force values at both the maximum and minimum levels so as to obtain an efficient and acceptable maximum and minimum force values for the deformation mechanisms.

Figure 7A:
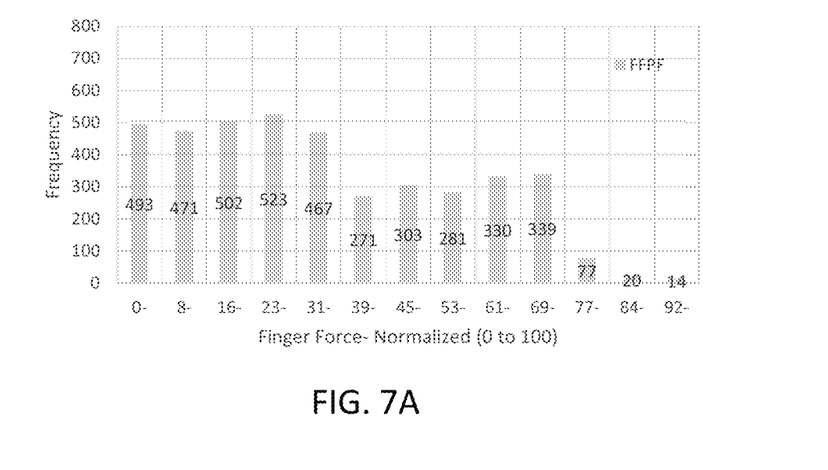
FIGS. 7A & 7B graphically illustrate the improvement provided by the force optimization algorithm of the present disclosure.
Figure 7B:
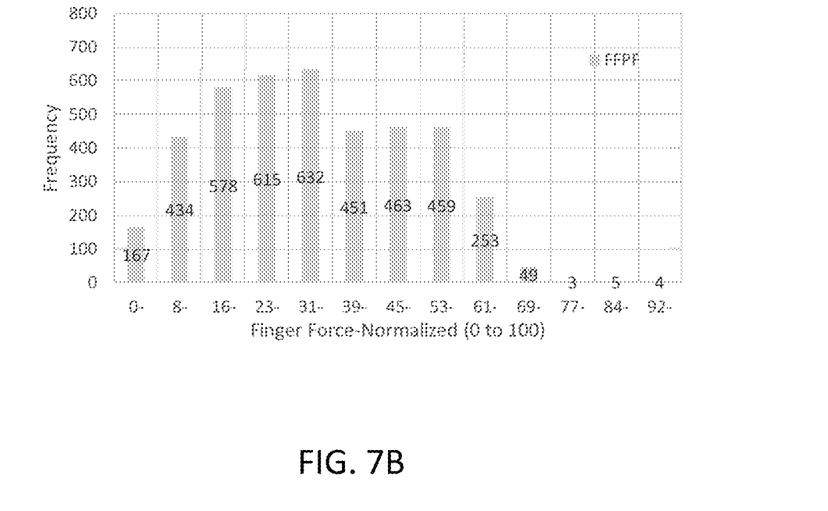

The improved result of the optimization algorithm can be seen when viewing the graphs of FIGS. 7A and 7B. FIG. 7A illustrates the frequency (number of instances) at which different force values are applied by the deformation mechanisms when using only the initial optimization performed in S402 described above. These are the frequencies for all imprint fields on a wafer. FIG. 7B illustrates the results when the entire optimization algorithm of FIG. 4 (and any additional described embodiments) are implemented. When comparing the frequency at which the upper-most and lower-most force values are applied in FIG. 7B to those in FIG. 7A, one can see the significant reduction of frequency at the upper-most and lower-most force values but yielded substantially the same overlay on the substrate such that the residual difference was within the tolerance threshold (in this example—tolerance threshold was set at 0.1 nm). The reduction at the upper and lower range of forces advantageously increases the available range for the closed loop alignment control and correction processing i.e. for correcting first set of distortions.

For a statistical performance evaluation of this new method with the current method, we can evaluate the performance over the entire wafer to see the improvement illustrated in FIGS. 6, 7A & 7B. By providing a distortion correction tradeoff that is within a predetermined threshold tolerance (e.g. 0.05 nm) results in a minimally worse distortion correction but the observed distribution of the number of deformation mechanisms in different force ranges after the high order distortion correction is improved. It is desired that fewer deformation mechanisms are in the higher force ranges closer to the maximum force range as the probablity of saturation increases for those deformation mechanisms when the closed loop control for alignment begins. Turning back to FIG. 7A, without the optimization algorithm there are 450 (339+77+20+14) instances of deformation mechanisms being in the force range larger than 69% of the normalized force thus, having a higher probability of saturation of these deformation mechanisms. Turning to FIG. 7B which illustrates the results when the efficient force limit optimization algorithm described above is executed, the number of instances of deformation mechanisms being larger than the 69% of the normalized force drops from 450 to 61 (49+3+5+4). In general, FIG. 7B shows the number of instances of the deformation mechanisms going into the upper and lower force ranges is significantly reduced.

As a result the algorithm described herein determines an efficient set of deformation mechanism forces without sacrificing the overlay correction potential of high order distortion correction. In doing so, the set of forces applied to the edges of a particular template are redistributed and relaxed in the calculation such that a new set of forces are equal to or narrower in range than the set of forces used in the conventional optimization method and, the overlay residual stays within a tolerance specification as determined to be dependent upon the imprint process & tool repeatability. Thus, the new overlay residual stays substantially the same as the previous overlay residual.

A number of implementations have been described. Nevertheless, it will be understood that various modifications may be made without departing from the spirit and scope of the disclosure. Accordingly, other implementations are within the scope of the following claims.

An embodiment of the present disclosure can be carried out by providing a program implementing one or more functions of the above-described embodiment to a system or apparatus via a network or storage medium and reading and executing the program with one or more processors in a computer of the system or apparatus. Also, an embodiment of the present disclosure can be carried out by a circuit implementing one or more functions (for example, an application specific integrated circuit (ASIC)).

Embodiment(s) of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

In referring to the description, specific details are set forth in order to provide a thorough understanding of the examples disclosed. In other instances, well-known methods, procedures, components, and circuits have not been described in detail as not to unnecessarily lengthen the present disclosure.

It should be understood that if an element or part is referred herein as being "on", "against", "connected to", or "coupled to" another element or part, then it may be directly on, against, connected or coupled to the other element or part, or intervening elements or parts may be present. In contrast, if an element is referred to as being "directly on", "directly connected to", or "directly coupled to" another element or part, then there are no intervening elements or parts present. When used, term "and/or", includes any and all combinations of one or more of the associated listed items, if so provided.

Spatially relative terms, such as "under" "beneath", "below", "lower", "above", "upper", "proximal", "distal", and the like, may be used herein for ease of description to describe one element or feature's relationship to another element(s) or feature(s) as illustrated in the various figures. It should be understood, however, that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, a relative spatial term such as "below" can encompass both an orientation of above and below. The device may be otherwise oriented (rotated 90° or at other orientations) and the spatially relative descriptors used herein are to be interpreted accordingly. Similarly, the relative spatial terms "proximal" and "distal" may also be interchangeable, where applicable.

The term "about," as used herein means, for example, within 10%, within 5%, or less. In some embodiments, the term "about" may mean within measurement error.

The terms first, second, third, etc. may be used herein to describe various elements, components, regions, parts and/or sections. It should be understood that these elements, components, regions, parts and/or sections should not be limited by these terms. These terms have been used only to distinguish one element, component, region, part, or section from another region, part, or section. Thus, a first element, component, region, part, or section discussed below could be termed a second element, component, region, part, or section without departing from the teachings herein.

The terminology used herein is for the purpose of describing particular embodiments only and is not intended to be limiting. As used herein, the singular forms "a", "an", and "the", are intended to include the plural forms as well, unless the context clearly indicates otherwise. It should be further understood that the terms "includes" and/or "including", when used in the present specification, specify the presence of stated features, integers, steps, operations, elements, and/or components, but do not preclude the presence or addition of one or more other features, integers, steps, operations, elements, components, and/or groups thereof not explicitly stated.

The foregoing merely illustrates the principles of the disclosure. Various modifications and alterations to the described exemplary embodiments will be apparent to those skilled in the art in view of the teachings herein.

In describing example embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner.

We claim:

1. A method of optimizing amounts of force available for each of a plurality of deformation mechanisms that apply forces to a template during imprint processing, comprising:

selecting a first set of forces within a first set of force limits of each of the plurality of deformation mechanisms and to be applied thereby to edges of the template;

estimating a first residual distortion that is representative of a first predicted overlay error by simulating an imprinting method in which the first set of forces are applied to the edges of the template wherein the first residual distortion represents an overlay error that would not be corrected during the simulated imprinting method;

selecting a second set of forces within a second set of force limits of each of the plurality of deformation mechanisms and to be applied thereby to the edges of the template;

estimating a second residual distortion that is representative of a second predicted overlay error by simulating the imprinting method in which the second set of forces are applied to edges of the template wherein the second residual distortion represents an overlay error that would not be corrected during the simulated imprinting method; and selecting, for each of the plurality of deformation mechanisms and from among the first set of forces and the second set of forces, an initial set of forces for imprint processing, wherein the selected initial set of forces has a narrowest set of force limits and a residual distortion that is below a threshold distortion tolerance for the template.

2. The method of claim 1, wherein residual distortion is a statistical metric of a set of predicted overlay error values.

3. The method of claim 2, wherein the statistical metric is one of: a standard deviation; a range; a maximum value; a mean; and a median.

4. The method of claim 1, wherein:
the second force limits are within the first force limits;
the second residual distortion is higher than the first residual distortion;
the second residual distortion is less than the residual threshold; and
the initial set of forces is the second set of forces.

5. The method of claim 1,
wherein the second set of forces is selected as the initial set of forces when the second residual distortion is:
within a repeatability tolerance of the first residual distortion; or
higher than the first residual distortion.

6. The method of claim 1,
imprinting a film on a field using the initial set of forces;
wherein the imprinting includes adjusting the initial set of forces within widest of the first set of forces limits and the second set of force limits in response to alignment signals received while imprinting the film.

7. The method of claim 1, the residual distortion is relative to a desired distortion of the template based on measured or predicted substrate distortions in a substrate to be imprinted by the template.

8. The method of claim 1, wherein the first set of forces limits is widest set of force limits that would be used during imprinting;
wherein the residual threshold is sum of the first residual distortion and a tolerance threshold;
wherein the initial set of forces is the second set of forces when the second residual distortion is less than the residual threshold.

9. The method of claim 1, wherein the first set of forces limits is wider than the second set of force limits;
wherein the residual threshold is sum of the first residual distortion and a tolerance threshold;
wherein the initial set of forces is the second set of forces when the second residual distortion is less than the residual threshold.

10. A method of manufacturing articles including using the method recited in claim 1, the method of manufacturing articles further comprising:
dispensing an imprint resist on a substrate, the imprint resist being a liquid;
contacting the imprint resist with an object having a pattern thereon that contacts the imprint resist;
processing the substrate on which the imprint resist has been dispensed so as to manufacture the articles.

11. The method of manufacturing according to claim 1, wherein processing the substrate further comprises:
applying energy to the substrate to cure the imprint resist and form a pattern on the substrate that corresponds to the pattern on the object;
wherein the method repeatedly performed while the object is in contact with the imprint resist, such that the object and substrate are aligned prior to the resist being cured by the applied energy.

12. The method according to claim 1, wherein the overlay error that would not be corrected is a high order distortion error.

13. The method according to claim 1, wherein the threshold distortion tolerance is an acceptable overlay error and the selected initial set of forces are such that an amount of force available for low order correction during imprint processing is increased.

\* \* \* \* \*